(12) United States Patent
Nasu et al.

(10) Patent No.: US 6,656,255 B2
(45) Date of Patent: Dec. 2, 2003

(54) COPPER SOURCE LIQUID FOR MOCVD PROCESSES AND METHOD FOR THE PREPARATION THEREOF

(75) Inventors: Akinobu Nasu, Ibaraki Prefecture (JP); Jean-Marc Girard, Ibaraki Prefecture (JP)

(73) Assignee: L'Air Liquide Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 110 days.

(21) Appl. No.: 09/961,242

(22) Filed: Sep. 25, 2001

(65) Prior Publication Data

US 2003/0183121 A1 Oct. 2, 2003

(30) Foreign Application Priority Data

Sep. 25, 2000 (JP) ......................................... 2000-290239

(51) Int. Cl.$^7$ ............................... C09D 5/24; C23C 16/18
(52) U.S. Cl. .................. 106/1.18; 106/287.12; 106/287.13; 106/287.14; 106/287.15; 106/287.16
(58) Field of Search ........................... 106/1.18, 287.12, 106/287.13, 287.14, 287.15, 287.16

(56) References Cited

U.S. PATENT DOCUMENTS

| | | | | |
|---|---|---|---|---|
| 5,144,049 A | * | 9/1992 | Norman et al. ............... 556/12 |
| 5,767,301 A | * | 6/1998 | Senzaki et al. ............... 556/9 |
| 5,953,634 A | * | 9/1999 | Kajita et al. ............... 438/687 |
| 6,015,918 A | * | 1/2000 | Zhuang et al. ............... 556/117 |
| 6,090,960 A | * | 7/2000 | Senzaki et al. ............... 556/9 |
| 6,090,964 A | * | 7/2000 | Rhee et al. ................... 556/117 |
| 6,102,993 A | * | 8/2000 | Bhandari et al. ........... 106/1.18 |
| 6,110,530 A | * | 8/2000 | Chen et al. ................... 427/253 |
| 6,310,228 B1 | * | 10/2001 | Itsuki et al. .................... 556/9 |
| 6,362,099 B1 | * | 3/2002 | Gandikota et al. .......... 438/687 |
| 6,440,494 B1 | * | 8/2002 | Arena-Foster ............... 427/250 |
| 6,576,293 B2 | * | 6/2003 | Zhuang et al. ............... 427/252 |

* cited by examiner

Primary Examiner—Helene Klemanski
(74) Attorney, Agent, or Firm—Burns, Doane, Swecker & Mathis, L.L.P.

(57) ABSTRACT

Provided is a copper source liquid useful in MOCVD processes for forming copper thin films on semiconductor wafers. The source liquid comprises water and a source component wherein the source component contains at least 90 weight % Cu(hfac)TMVS and the copper source liquid preferably contains no more than 10 weight % water. The dissolved oxygen concentration in the water is established at no more than 0.5 ppm relative to the water. Decomposition of the Cu(hfac)TMVS is controlled in the present invention by lowering the dissolved oxygen concentration in the water. The resulting copper source liquid allows for improved reproducibility of CVD film quality by raising the capacity to control the amount of water addition to the copper source liquid used in MOCVD processes.

24 Claims, 2 Drawing Sheets

COPPER SOURCE LIQUID FOR MOCVD PROCESSES AND METHOD FOR THE PREPARATION THEREOF

This application claims priority under 35 U.S.C. §§119 and/or 365 to 2000-290239 filed in Japan on Sep. 25, 2000; the entire content of which is hereby incorporated by reference.

BACKGROUND OF THE INVENTION

1. Field of the Invention

The present invention relates to a copper source liquid for use in MOCVD (metal organic chemical vapor deposition) processes that produce copper-containing films on substrates by CVD. The invention also relates to a method for producing this copper source liquid.

2. Description of the Related Art

Aluminum and aluminum alloys are most often used as the material in the electrodes and interconnects in semiconductor devices. Copper, on the other hand, is used as a component in the electrode and interconnect layers, for example, as the material of barrier layers, and is used as an alloying component with aluminum. In addition, rapid progress has recently been made toward the realization of copper interconnects as a replacement for aluminum interconnects.

Vapor deposition and sputtering are the methods generally used to form copper and copper alloy films on semiconductor wafers. Very recently, however, technology has been developed that enables the formation of copper and copper alloy films by MOCVD. (Hexafluoroacetylacetonato)copper (I)×trimethylvinylsilane (chemical formula: $(O_2C_5HF_6)$ Cu×$(CH_3)_3SiCH=CH_2$) is typically used as the copper source liquid. This copper source liquid is stored in the liquid phase in a storage means, transported from the storage means through a vaporizer, and, after conversion into vapor form, is supplied to the treatment compartment holding the treatment substrate and is employed therein for film formation. A small amount of water is added to the aforementioned copper source liquid in order to promote decomposition during the film-formation process and thereby raise the film-formation rate and to improve the adherence between the CVD film and substrate. This water addition has been carried out within the treatment compartment or immediately upstream therefrom since the addition of water to the subject copper source liquid has resulted in rapid decomposition of the copper source liquid with a corresponding decline in its quality. Water addition in this manner also results in a reduced level of control with regard to the quantity of water added to the copper source liquid, which in turn causes a diminished reproducibility on the part of CVD film quality.

This invention was developed in view of the foregoing problems with the prior art. The object of this invention is to improve the reproducibility of CVD film quality by improving the capacity to control the amount of water added to the copper source liquid used in MOCVD processes.

SUMMARY OF THE INVENTION

In a first embodiment, the present invention provides a copper source liquid for MOCVD processes (hereafter referred to as MOCVD copper source liquid) that characteristically comprises a copper source component and water, wherein the source component comprises at least 90 weight % of a substance with the chemical formula (1)

$$(O_2C_5HF_6)Cu\times L \quad (1)$$

in which L is an electrically neutral organic ligand that contains a carbon-carbon multiple bond whose p-electrons participate in coordination bonding with the monovalent copper; and the dissolved oxygen concentration in the water is no more than 0.5 ppm relative to the water.

In a second embodiment, the present invention provides a MOCVD copper source liquid according to the first embodiment, characterized in that the proportion of water in the copper source liquid is no more than 10 weight %.

In a third embodiment of the present invention, a MOCVD copper source liquid according to the first or second embodiment is provided, characterized in that the source component contains less than 10 weight % L of chemical formula (1) separate from the aforesaid substance with chemical formula (1).

In a fourth embodiment, the present invention provides a MOCVD copper source liquid according to any of the first to third embodiment, characterized in that L in chemical formula (1) is an organic ligand selected from the group consisting of trimethylvinylsilane, allyltrimethylsilane, vinyltrimethoxysilane, triethoxyvinylsilane, dimethoxymethylvinylsilane, vinylcyclohexane, 2-methyl-1-hexen-3-yne, 3,3-dimethyl-1-butene, and 1,5-cyclooctadiene.

In a fifth embodiment, the present invention provides a MOCVD copper source liquid according to any of the first to third embodiments, characterized in that L in chemical formula (1) is $R_3Si(CH_2)_nCH=CH_2$ wherein the subscript n is zero or a positive integer and R denotes alkyl or alkoxyl.

In a sixth embodiment, the present invention provides a MOCVD copper source liquid according to any of the first to third embodiments, characterized in that L in chemical formula (1) is $R_2C=CH_2$ wherein R is H or hydrocarbyl.

In a seventh embodiment of the present invention, the present invention provides a MOCVD copper source liquid according to any of the first to third embodiments, characterized in that L in chemical formula (1) is $(CH_3)_3SiCH=CH_2$.

In another embodiment of the present invention, there is provided a method for producing MOCVD copper source liquid according to any of the first to seventh embodiments, said method comprising
 a process in which the oxygen dissolved in the water is removed by mixing the water and a deoxygenating agent with a compound of chemical formula (1) to form a liquid mixture and stirring the liquid mixture,
 a process in which, after completion of stirring of the liquid mixture, the water is separated from the deoxygenating agent and is recovered, and
 a process in which the aforementioned substance of chemical formula (1) and the water recovered from the liquid mixture are mixed in order to form the copper source liquid.

In a ninth embodiment of the present invention, there is provided a method for producing MOCVD copper source liquid according to any of the first to seventh embodiments, said method characteristically comprising
 a process in which an inert gas is bubbled through water in order to remove the oxygen dissolved in the water, and
 a process in which the copper source liquid is formed by mixing the bubbling-treated water with the aforementioned substance of chemical formula (1).

The aforementioned embodiments of this invention explore a variety of executions of this invention, and various embodiments of this invention can be derived by suitable combination of a plural number of disclosed constituent elements. For example, when an embodiment of the present invention has been derived by omitting some constituent elements from the overall set of constituent elements presented for the embodiment, these omitted elements can be suitably fulfilled by conventional well-known technologies in the actual working of the derived inventive embodiment.

Reference Symbols

Figure 1:
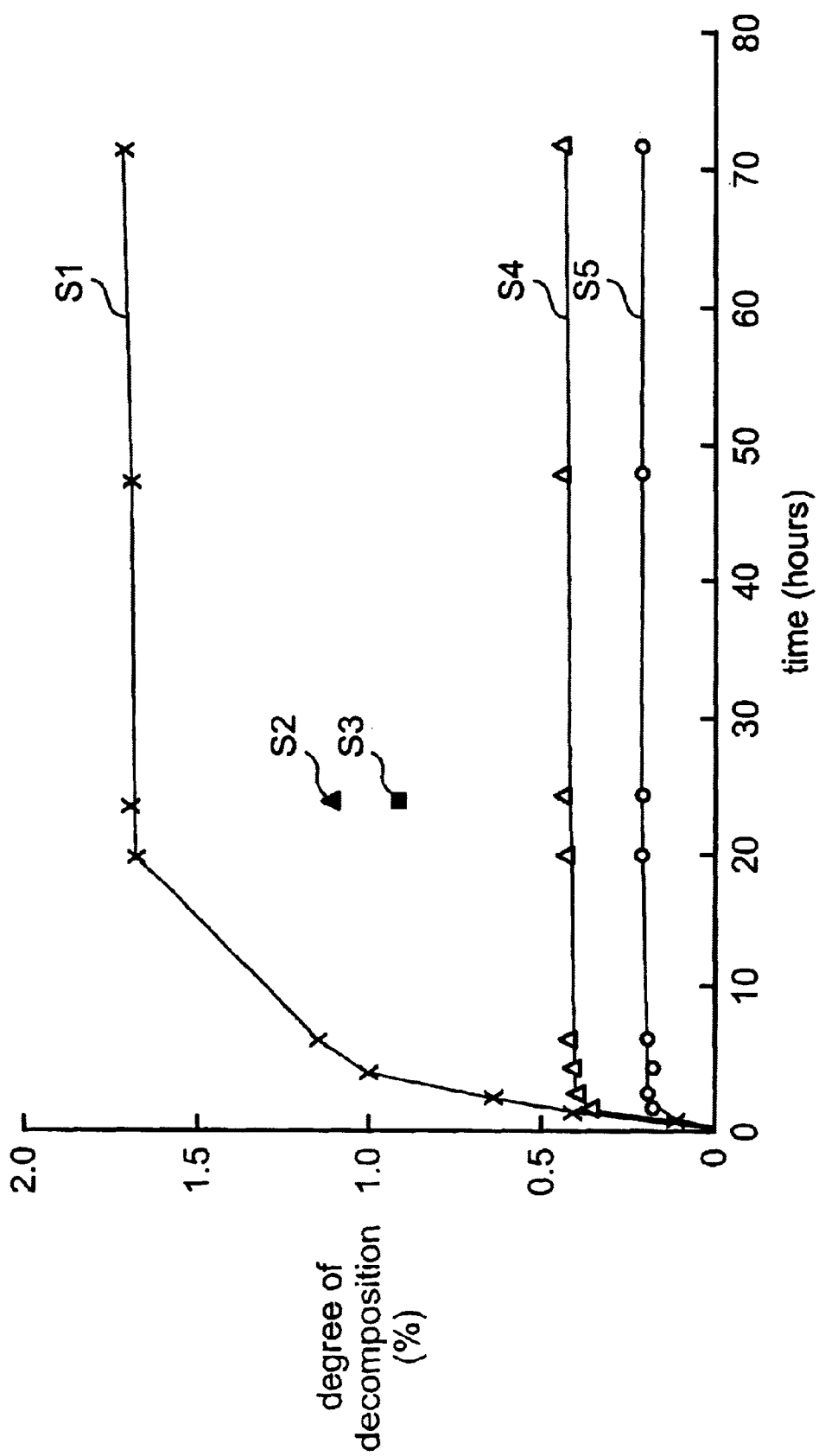
FIG. 1 contains a graph that illustrates the degree of decomposition of the source component in the samples over time in Experiment 1.

S1 to S5 measurement results for samples S1 to S5 in Experiment 1

S11, S14, S15 measurement results for samples S11, S14, and S15 in Experiment 2

DETAILED DESCRIPTION OF THE PREFERRED EMBODIMENTS

Hexafluoroacetylacetonato)copper(I)×trimethylvinylsilane of chemical formula: $(O_2C_5HF_6)Cu \times (CH_3)_3SiCH=CH_2$, typically represented as Cu(hfac)TMVS is traditionally used as a copper source liquid in the production of copper and copper alloy films by MOCVD, but is an unstable liquid that spontaneously decomposes according to the following chemical equation, in which hfac represents $O_2C_5HF_6$ and TMVS represents $(CH_3)_3SiCH=CH_2$:

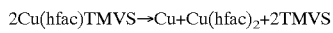

2Cu(hfac)TMVS→Cu+Cu(hfac)$_2$+2TMVS

During the development of this invention, the inventors carried out research into the cause of the acceleration of Cu(hfac)TMVS decomposition that occurs upon the addition of water. The inventors discovered as a consequence of the research that the decomposition of this substance is not accelerated by water itself, but rather is accelerated, inter alia, by the dissolved oxygen present in the water.

Experiments illustrating this discovery are shown below. Five types of process water were prepared for these experiments. In each case, the particular process water was added to Cu(hfac)TMVS and the progress of Cu(hfac)TMVS decomposition was monitored.

Types of Process Water (1) Process water W1: dissolved oxygen concentration=approximately 8.4 ppm Process water W1 was prepared by allowing ion-exchanged water—itself prepared by conventional method—to stand in the air for an extended period of time. It was assumed that under these conditions the dissolved oxygen in the water reached a condition of equilibrium with the air.

(2) Process water W2: dissolved oxygen concentration=approximately 2.4 ppm

Process water W2 was prepared by boiling process water W1 for 1 hour at 100° C. followed by cooling to room temperature without contact with air. Since the gas solubility in water declines as the temperature of water is raised, the oxygen dissolved in the water was expelled by boiling at 100° C.

(3) Process water W3: dissolved oxygen concentration=approximately 1.0 ppm

Process water W3 was prepared by bubbling process water W1 with pure hydrogen for 24 hours. During this period, the dissolved oxygen concentration became almost constant beyond 1 hour of bubbling. The oxygen dissolved in the water was purged by the hydrogen during hydrogen bubbling, and presumably the dissolved hydrogen concentration in the water—although not measured—underwent an increase in its place.

(4) Process water W4: dissolved oxygen concentration=approximately 0.1 ppm

Process water W4 was prepared by bubbling process water W1 for 24 hours with pure nitrogen. During this period, the dissolved oxygen concentration became almost constant beyond 1 hour of bubbling. The oxygen dissolved in the water was purged by the nitrogen during nitrogen bubbling, and presumably the concentration of inert nitrogen dissolved in the water—although not measured—underwent an increase in its place. It was also assumed that inert nitrogen would not accelerate decomposition of Cu(hfac)TMVS.

(5) Process water W5: dissolved oxygen concentration less than 0.1 ppm

Process water W5 was prepared by mixing process water W1 with deoxidizing agent (Cu(hfac)TMVS) in a volumetric ratio of approximately 10:1 and vigorously stirring the resulting liquid mixture for 30 minutes. The length of the stirring process is not crucial here, and it is sufficient to carry out stirring simply until the two liquids have been thoroughly intermixed. The liquid mixture was then allowed to stand at quiescence. After the water and deoxidizing agent had separated into two layers (upper and lower), the water upper layer was taken off and used as process water W5. The two liquids spontaneously separated into upper and lower layers since they are incompatible and have different specific gravities (Cu(hfac)TMVS density=1.394 g/mL). The dissolved oxygen concentration in process water W5 prepared as described above was below the measurement limit and for this reason was assigned a value of less than 0.1 ppm.

Experiment 1

Each process water (process waters W1 through W5) was mixed into a copper source component (substantially 100% pure Cu(hfac)TMVS) at a volumetric ratio of approximately 1:10, and the resulting liquid mixture was stirred vigorously for several minutes. The liquid mixture was then held at quiescence, whereupon the water and Cu(hfac)TMVS separated into two layers (upper and lower).

Since the saturation solubility of water in 100% pure Cu(hfac)TMVS is 820 ppm, the preparation of water-spiked Cu(hfac)TMVS requires the addition of only trace amounts of water. However, excess water was added in Experiment 1 in order to elucidate the differences in the results in Cu(hfac)TMVS decomposition as a function of the type of process water added (different dissolved oxygen concentrations).

The water-spiked Cu(hfac)TMVSs prepared as described above were designated samples S1 to S5 in correspondence to the particular process waters W1 to W5 added (see above for the 5 types of process water). Each copper source component was measured for the amount of water dissolved therein and the timewise course of its decomposition. The amount of dissolved water was measured by the known Karl Fischer method. The degree of decomposition was measured based on the absorbance by the source component in samples S1 to S5 at 669 mn.

The relationship between the degree of Cu(hfac)TMVS decomposition and the absorbance at 669 nm will now be considered. The Cu(hfac)$_2$ produced by the spontaneous decomposition of Cu(hfac)TMVS exhibits an absorption maximum at 669 nm with a molar absorptivity of approximately 34.2. In contrast, pure (100%) Cu(hfac)TMVS and pure (100%) TMVS both exhibit almost no absorption at 669 nm. An example of the relationship between the degree of Cu(hfac)TMVS decomposition and the absorbance at 669 nm is given below for an optical path length of 10 mm:

0.040 (0% decomposition)
0.650 (0.5% decomposition)
1.294 (1% decomposition)
1.943 (1.5% decomposition)
2.432 (2% decomposition)

Thus, measurement of the absorbance of the source component in samples S1 to S5 at 669 nm enables estimation of the degree of Cu(hfac)TMVS decomposition.

Measurements were carried out in Experiment 1 at 1, 2, 4, 6, 20, 24, and 72 hours after addition of the process water. However, due to the impracticalities imposed by the time and effort required to prepare process water W2 and process water W3, sample S2 (addition of process water W2) and sample S3 (addition of process water W3) were measured only at 24 hours after addition of the process water. The results obtained in Experiment 1 for the dissolved water concentration were as follows: the dissolved water concentration in the source component in samples S1 to S5 was approximately 820 ppm, and this value underwent almost no timewise variation.

The data plotted in FIG. 1 were obtained for the degree of decomposition of the source component in the samples. According to FIG. 1, sample S4 (addition of process water W4) and sample S5 (addition of process water W5) had a much lower degree of decomposition than did sample S1 (addition of process water W1) and reached a constant value for the degree of decomposition faster than did sample S1 (addition of process water W1). In other words, it was confirmed that the dissolved oxygen concentration in the process water added to the Cu(hfac)TMVS had a major influence on the degree of Cu(hfac)TMVS decomposition and on the time course of this decomposition.

Experiment 2

The preparative sequence described for Experiment 1 was carried out, but in this experiment the process water was mixed at a volumetric ratio of about 1:10 into a source component comprising of 95% Cu(hfac)TMVS and 5% TMVS. Three process waters, W1, W4, and W5, were used in this experiment. This yielded water-spiked Cu(hfac)TMVS+TMVS samples S11, S14, and S15, respectively, for the addition of process water W1, W4, and W5. The dissolved water concentration in the source component and the time course of the degree of source component decomposition were measured on samples S11, S14, and S15.

Measurements were carried out in Experiment 2 at 1, 2, 4, 6, 20, 24, and 72 hours after addition of the process water. The results obtained in Experiment 2 for the dissolved water concentration were as follows: the dissolved water concentration in the source component in samples S11, S14, and S15 was approximately 770 ppm, and this value underwent almost no timewise variation. The dissolved water concentration in the 95% Cu(hfac)TMVS+5% TMVS source component was thus about 50 ppm less than in the 100% Cu(hfac)TMVS source component; this is thought to be due to the strong hydrophobicity of TMVS. The saturation solubility of water in TMVS is approximately 290 ppm.

Figure 2:
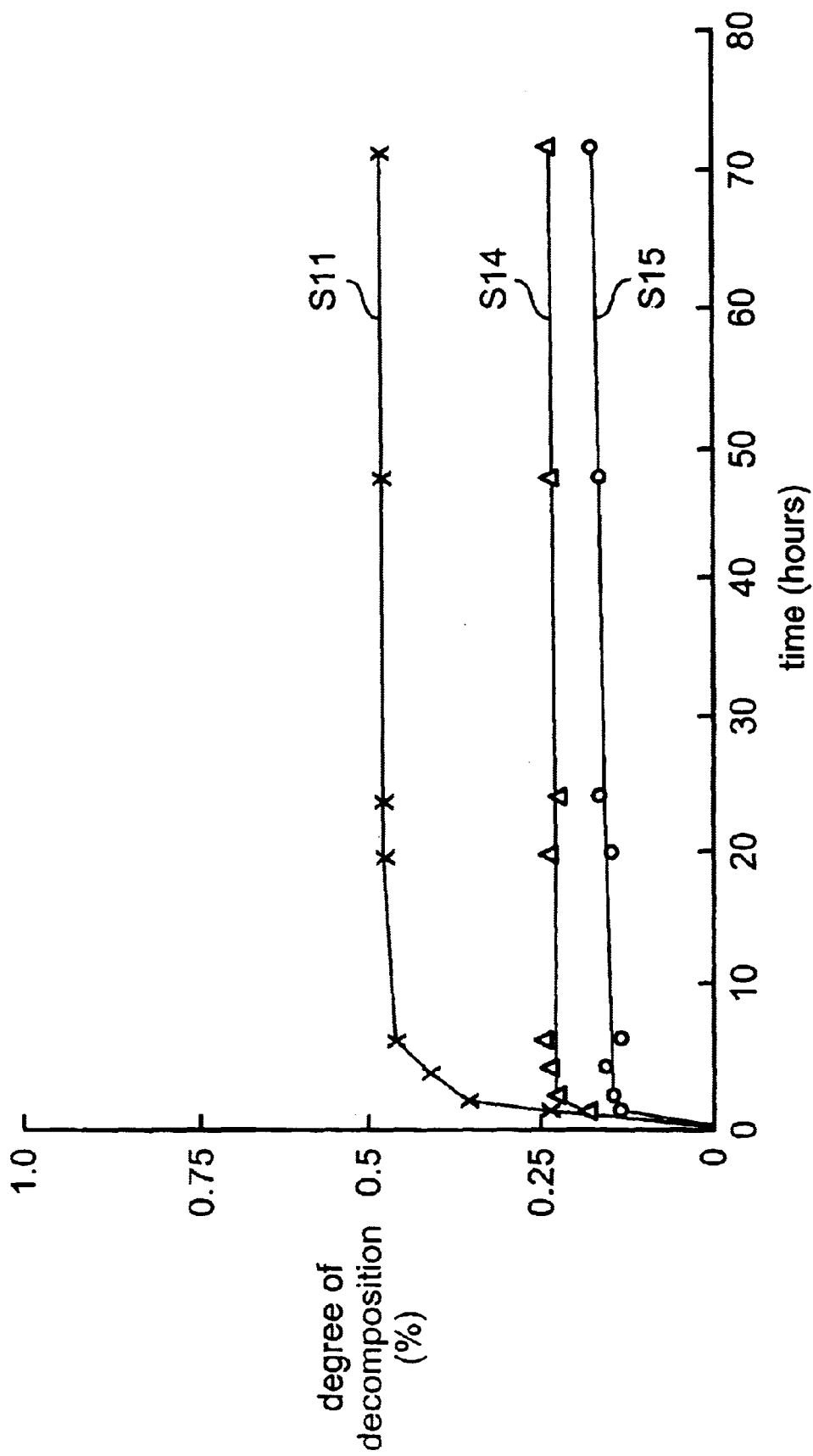
FIG. 2 contains a graph that illustrates the degree of decomposition of the source component in the samples over time in Experiment 2.

The data plotted in FIG. 2 were obtained for the degree of decomposition of the source component in the sample. According to FIG. 2, sample S14 (addition of process water W4) and sample S15 (addition of process water W5) had a much lower degree of decomposition than did sample S11 (addition of process water W1) and reached a constant value for the degree of decomposition faster than did sample S11 (addition of process water W1). In other words, it was confirmed that the dissolved oxygen concentration in the process water added to the Cu(hfac)TMVS+TMVS had a major influence on the degree of Cu(hfac)TMVS+TMVS decomposition and on the time course of this decomposition.

As already discussed above, it has heretofore been thought that the addition of water to Cu(hfac)TMVS resulted in rapid decomposition of the latter with a corresponding decline in its quality. However, it was discovered that the decomposition of Cu(hfac)TMVS is not accelerated by the water itself, but rather is accelerated by the oxygen dissolved in the water. A small amount of water is added to Cu(hfac)TMVS-based MOCVD copper source liquids in order to promote decomposition during the film formation process and thereby raise the film-formation rate and in order to improve the adherence between the CVD film and treatment substrate. When, according to the present invention, the dissolved oxygen concentration in the water is reduced, water addition to the copper source liquid can be carried out on the source liquid stored in a source tank or prior to the supply of the source liquid to the user—as opposed to the practice in the prior art of adding the water immediately before the treatment compartment or within the treatment compartment. The invention therefore creates a greater capacity to control the amount of water added to MOCVD copper source liquids, which in turn enables an improved reproducibility of CVD film quality.

The foregoing explanation has been provided using the example of Cu(hfac)TMVS (chemical formula: $(O_2C_5HF_6)$Cu.$(CH_3)_3$SiCH=CH$_2$) for the copper source liquid, but the present invention is also applicable to source liquids that have similar properties. Source liquids with similar properties can be represented by chemical formula (1).

$(O_2C_5HF_6)$Cu.L  (1)

in which:

L is an electrically neutral organic ligand that contains a carbon-carbon multiple bond whose p-electrons participate in coordination bonding with the monovalent copper.

L in chemical formula (1) can be, for example, any of the following organic ligands (a) through (i), which includes the exemplary ligand employed in the foregoing explanation.

(a) trimethylvinylsilane: $(CH_3)_3$SiCH=CH$_2$
(b) allyltrimethylsilane: $(CH_3)_3$SiCH$_2$CH=CH$_2$
(c) vinyltrimethoxysilane: $(OCH_3)_3$SiCH=CH$_2$
(d) triethoxyvinylsilane: $(OC_2H_5)_3$SiCH=CH$_2$
(e) dimethoxymethylvinylsilane: $(OCH_3)_2(CH_3)$SiCH=CH$_2$
(f) vinylcyclohexane: $(C_6H_{11})$CH=CH$_2$
(g) 2-methyl-1-hexen-3-yne: $C_2H_5$COCC$(CH_3)$=CH$_2$
(h) 3,3-dimethyl-1-butene: $(CH_3)_3$CCH=CH$_2$
(i) 1,5-cyclooctadiene In the case of the silicon-containing organic ligands L in (a) through (e) above, L in (1) can be more generally expressed by $R_3$Si$(CH_2)_n$CH=CH$_2$ wherein n is zero or a positive integer and R denotes alkyl or alkoxyl. In the case of (f) through (i) above, L in (1) can be more generally expressed by $R_2$C=CH$_2$ wherein R denotes H or hydrocarbyl.

The present invention is not limited to instances in which essentially the entire (100%) source component in the source liquid is composed of a substance with chemical formula (1). For example, in some cases TMVS (the same TMVS as specified above for the L in chemical formula (1)) is added as a stabilizer to the Cu(hfac)TMVS employed as MOCVD copper source liquid in order to improve the stability of the Cu(hfac)TMVS, that is, in order to prevent its decomposition prior to film formation. However, since an excess addition of TMVS runs the risk of degrading film quality, the source component of the source liquid in this case is prepared—taking the various considerations into account using at least 90 weight % Cu(hfac)TMVS and less than 10 weight % TMVS. Thus, the present invention is also intended for application to source liquids that also substantially contain a substance other than a substance of chemical formula (1).

The MOCVD copper source liquid according to the present invention comprises a source component and water wherein the source component contains at least 90 weight % of a substance of chemical formula (1). The dissolved oxygen concentration in the water is desirably no more than 0.5 ppm relative to the water and more desirably is no more than 0.1 ppm. The amount of water in the copper source liquid is desirably no more than 10 weight % but at least 10 ppm and more desirably is no more than 6 weight % but at least 100 ppm. In addition, the source component can contain less than 10 weight % L of formula (1) separate from the substance with chemical formula (1).

The proportion of water in the copper source liquid can be increased to larger values as long as the MOCVD process is not impaired, but large amounts of water have negative consequences for storage and transport of the copper source liquid. Moreover, while it is permissible for the water present in the copper source liquid to separate from the source component, it is desirable that the water be present in a dissolved state to the maximum extent possible. Thus, the upper limit on the amount of water in the copper source liquid is desirably approximately the upper limit on the amount of dissolved water and as a general rule is desirably up to the saturation point of water in the 100% pure substance with chemical formula (1). Additional increases in the amount of dissolved water in the copper source liquid can be obtained by mixing an assistant such as an alcohol or ether into the copper source liquid.

Depending on the specifications for the MOCVD process, the lower limit on the amount of water in the copper source liquid may in some cases be below the aforementioned saturation solubility limit for water. However, the lower limit on the amount of water should be a value within the range given above in order to obtain the effects of water addition.

The dissolved oxygen concentration in the water is desirably as low as possible, but lowering the dissolved oxygen concentration also entails additional costs and additional time requirements. The range given above is the preferred range when one considers the balance between the required costs and time inputs and the advantageous effects from a lower dissolved oxygen concentration.

As described above with regard to process water W5, the dissolved oxygen concentration in the water can be lowered using a method that employs a substance of chemical formula (1) as a deoxygenating agent. This particular method offers two advantages: it brings about a substantial decline in the dissolved oxygen concentration in the water, and, since the deoxygenating agent is identical to the source component, it avoids the risk of product contamination that could arise from the presence of residual deoxygenating agent in the process water.

The preparation of a MOCVD copper source liquid using this method proceeds as follows. First, water and deoxygenating agent with chemical formula (1) are mixed to form a liquid mixture and the oxygen dissolved in the water is removed by thoroughly stirring the liquid mixture. The length of the stirring process is not critical, and it will be sufficient simply to thoroughly intermix the two liquids.

The water and deoxygenating agent are subsequently separated and the water is recovered. In general, the two liquids will spontaneously separate into upper and lower layers since they are incompatible and also have different specific gravities. The copper source liquid is then prepared by mixing the water recovered from the liquid mixture with a substance of chemical formula (1).

Another method for lowering the dissolved oxygen concentration in the water, described above in relation to process water W4, employs bubbling of the water with a gas such as nitrogen. An inert gas other than nitrogen can also be used as the bubbling gas, for example, argon.

MOCVD copper source liquid can be prepared using this method by first bubbling inert gas through water in order to remove the dissolved oxygen in the water and then forming the copper source liquid by mixing the bubbling-treated water with a substance of chemical formula (1). About 1 hour of bubbling will be sufficient as longer times afford almost no additional decline in the dissolved oxygen concentration in the water.

The freeze-pump-thaw method is another method that can be used to lower the dissolved oxygen concentration in water. This method removes high vapor pressure substances (low boiling point substances) such as oxygen from water by freezing water under a vacuum exhaust. MOCVD copper source liquid in accordance with this invention can also be prepared using this method.

As has been described hereinabove, the present invention, by lowering the dissolved oxygen concentration in the water, enables the source component of the copper source liquid to remain stable even after the addition of water, which in turn makes possible the preparation of MOCVD copper source liquid to which water has already been added. The invention therefore provides for a greater capacity to control the amount of water addition to MOCVD copper source liquids and thereby enables an increased reproducibility in CVD film quality.

While various modifications and alterations within the technical sphere of the concept of this invention can be devised by the individual skilled in the art, it should be understood that these modifications and alterations also fall within the scope of this invention.

What is claimed is:

1. A copper source liquid for MOCVD processes, which comprises a source component and water, wherein the source component contains at least 90 weight % of a substance of chemical formula (1)

$$(O_2C_5HF_6)Cu.L \tag{1}$$

in which L is an electrically neutral organic ligand that contains a carbon-carbon multiple bond whose p-electrons participate in coordination bonding with the monovalent copper, and the dissolved oxygen concentration in the water is no more than 0.5 ppm relative to the water.

2. The copper source liquid of claim 1 for MOCVD processes, wherein the proportion of water in the copper source liquid is no more than 10 weight %.

3. The copper source liquid of claim 1 for MOCVD processes, wherein the source component contains less than 10 weight % L of chemical formula (1) separate from and in addition to the aforesaid substance of chemical formula (1).

4. The copper source liquid of claim 2 for MOCVD processes, wherein the source component contains less than 10 weight % L of chemical formula (1) separate from and in addition to the aforesaid substance of chemical formula (1).

5. The copper source liquid of claim 1, wherein L in chemical formula (1) is an organic ligand selected from the group consisting of trimethylvinyosilane, allyltrimethylsilane, vinyltrimethoxysilane, triethoxyvinylsilane, dimethoxymethylvinylsilane, vinylcyclohexane, 2-methyl-1-hexen-3-yne, 3,3-dimethyl-1-butene, and 1,5-cyclooctadiene.

6. The copper source liquid of claim 2, wherein L in chemical formula (1) is an organic ligand selected from the group consisting of trimethylvinylsilane, allyltrimethylsilane, vinyltrimethoxysilane, triethoxyvinylsilane, dimethoxymethylvinylsilane, vinylcyclohexane, 2-methyl-1-hexen-3-yne, 3,3-dimethyl-1-butene, and 1,5-cyclooctadiene.

7. The copper source liquid of claim 3, wherein L in chemical formula (1) is an organic ligand selected from the group consisting of trimethylvinylsilane, allyltrimethylsilane, vinyltrimethoxysilane, triethoxyvinylsilane, dimethoxymethylvinylsilane, vinylcyclohexane, 2-methyl-1-hexen-3-yne, 3,3-dimethyl-1-butene, and 1,5-cyclooctadiene.

8. The copper source liquid of claim 1, wherein L in chemical formula (1) is $R_3Si(CH_2)_nCH=CH_2$, with the subscript n being zero or a positive integer and R denotes alkyl or alkoxyl.

9. The copper source liquid of claim 2, wherein L in chemical formula (1) is $R_3Si(CH_2)_nCH=CH_2$, with the subscript n being zero or a positive integer and R denotes alkyl or alkoxyl.

10. The copper source liquid of claim 3, wherein L in chemical formula (1) is $R_3Si(CH_2)_nCH=CH_2$, with the subscript n being zero or a positive integer and R denotes alkyl or alkoxyl.

11. The copper source liquid of claim 1, wherein L in chemical formula (1) is $R_2C=CH_2$ where R is H or hydrocarbyl.

12. The copper source liquid of claim 2, wherein L in chemical formula (1) is $R_2C=CH_2$ where R is H or hydrocarbyl.

13. The copper source liquid of claim 3, wherein L in chemical formula (1) is $R_2C=CH_2$ where R is H or hydrocarbyl.

14. The copper source liquid of claim 1, wherein L in chemical formula (1) is $(CH_3)_3SiCH=CH_2$.

15. The copper source liquid of claim 2, wherein L in chemical formula (1) is $(CH_3)_3SiCH=CH_2$.

16. The copper source liquid of claim 3, wherein L in chemical formula (1) is $(CH_3)_3SiCH=CH_2$.

17. A method for producing a copper source liquid for MOCVD processes, the method comprising removing the oxygen dissolved in water by mixing the water and a deoxygenating agent of chemical formula (1) $(O_2C_5HF_6)$ Cu.L in which L is an electrically neutral organic ligand that contains a carbon-carbon multiple bond whose p-electrons participate in coordination bonding with the monovalent copper, to form a liquid mixture and stirring the liquid mixture, after completion of stirring of the liquid mixture, the water is separated from the deoxygenating agent and recovered, and mixing the substance of chemical formula (1) and the water recovered from the liquid mixture in order to form the copper source liquid.

18. The method of claim 17, wherein the copper source liquid produced is that of claim 1.

19. The method of claim 17, wherein the copper source liquid produced is that of claim 2.

20. The method of claim 17, wherein the copper source liquid produced is that of claim 3.

21. A method for producing a copper source liquid for MOCVD processes, the method comprising bubbling an inert gas through water in order to remove the oxygen dissolved in the water and mixing the bubbling-treated water with a substance of chemical formula (1) $(O_2C_5HF_6)$ Cu.L in which L is an electrically neutral organic ligand that contains a carbon-carbon multiple bond whose p-electrons participate in coordination bonding with the monovalent copper.

22. The method of claim 21, wherein the copper source liquid produced is that of claim 1.

23. The method of claim 21, wherein the copper source liquid produced is that of claim 2.

24. The method of claim 21, wherein the copper source liquid produced is that of claim 3.

* * * * *